(12) United States Patent
Draxelmayr et al.

(10) Patent No.: US 10,024,891 B2
(45) Date of Patent: Jul. 17, 2018

(54) METAL SHUNT RESISTOR

(71) Applicant: Infineon Technologies Austria AG, Villach (AT)

(72) Inventors: Dieter Draxelmayr, Villach (AT); Kofi Makinwa, Delft (NL); Saleh Heidary Shalmany, Delft (NL)

(73) Assignee: Infineon Technologies Austria AG, Villach (AT)

( * ) Notice: Subject to any disclaimer, the term of this patent is extended or adjusted under 35 U.S.C. 154(b) by 180 days.

(21) Appl. No.: 14/850,907

(22) Filed: Sep. 10, 2015

(65) Prior Publication Data
US 2017/0074912 A1 Mar. 16, 2017
US 2017/0254839 A9 Sep. 7, 2017

(30) Foreign Application Priority Data

Sep. 9, 2014 (DE) .................. 10 2014 013 368

(51) Int. Cl.
| | |
|---|---|
| G01R 1/44 | (2006.01) |
| G01R 19/32 | (2006.01) |
| G01R 1/20 | (2006.01) |
| G01K 7/01 | (2006.01) |
| G01R 19/00 | (2006.01) |
| G01R 15/14 | (2006.01) |
| H01L 29/73 | (2006.01) |

(52) U.S. Cl.
CPC .............. *G01R 19/32* (2013.01); *G01K 7/01* (2013.01); *G01R 1/20* (2013.01); *G01R 15/146* (2013.01); *G01R 19/00* (2013.01); *H01L 29/73* (2013.01)

(58) Field of Classification Search
None
See application file for complete search history.

(56) References Cited

U.S. PATENT DOCUMENTS

| | | | | |
|---|---|---|---|---|
| 5,396,120 | A * | 3/1995 | Iwasa ................. | H03K 17/0822 327/427 |
| 6,028,426 | A * | 2/2000 | Cameron ............... | G01R 1/203 324/126 |
| 7,307,328 | B2 * | 12/2007 | Meyer ...................... | G01K 7/01 257/370 |

(Continued)

FOREIGN PATENT DOCUMENTS

DE 10128433 C1 * 10/2002 ............... H01C 1/14

OTHER PUBLICATIONS

Shalmany, et al, "A Micropower Battery Current Sensor with ±0.03% (3σ) Inaccuracy from -40°C to + 85°C," 2013 IEEE International Solid-State Circuits Conference Digest of Technical Papers, Feb. 2013, 14 pp.

*Primary Examiner* — Patrick Assouad
*Assistant Examiner* — Demetrius Pretlow
(74) *Attorney, Agent, or Firm* — Shumaker & Sieffert, P.A.

(57) ABSTRACT

In one embodiment, a shunt resistor is provided, comprising two terminals, a semiconductor substrate embodying at least one temperature sensor comprising at least a temperature sensitive element comprising at least one pn-junction, and at least two metal layers above the semiconductor substrate, at least the upper of the metal layer comprising a path that electrically connects the two terminals, whereby the temperature sensor is below and within the periphery of the upper metal layer.

12 Claims, 3 Drawing Sheets

(56) References Cited

U.S. PATENT DOCUMENTS

| | | | | |
|---|---|---|---|---|
| 7,944,269 B2* | 5/2011 | Cortigiani | .......... | H03K 17/0822 327/512 |
| 2010/0001382 A1* | 1/2010 | Udompanyavit | . | H01L 23/49548 257/666 |
| 2011/0165755 A1* | 7/2011 | Zundel | .................. | H01L 21/743 438/386 |
| 2011/0291741 A1* | 12/2011 | Mayer | ................. | H01L 23/5228 327/513 |
| 2014/0320150 A1* | 10/2014 | Sato | ................... | G01R 31/3696 324/601 |
| 2015/0276497 A1* | 10/2015 | Miyazaki | ................. | G01K 7/01 374/170 |

\* cited by examiner

METAL SHUNT RESISTOR

BACKGROUND

Shunt resistors may be used in current-sensing systems (CSS). In one example, a metal shunt resistor may be serially connected to a battery. Battery current flowing through the shunt resistor causes a voltage drop which is measured with the help of an analog-to-digital converter (ADC). The shunt resistor has a large temperature coefficient of about 0,35% /° C. and it heats by about 6° C. per 1 A current through the resistor. There might be shunt resistors with a different temperature coefficient. For example, depending on the composition of the shunt (copper/aluminum, via construction . . . ), this might vary. Furthermore, there are "precision" shunts available as external components with quite low temperature coefficients (nominally zero). However, this costs board space and money. The output signal of a temperature sensor is used in a correction circuit of the analog-to-digital converter to compensate for the resistor's self-heating. Even with that compensation scheme, an inaccuracy of the current sensing remains due to the temperature dependency of the shunt resistor. Basically there are two major influence factors: Inaccuracy of the temperature coefficient and inaccuracy in the measurement of the actual shunt temperature.

SUMMARY

In one embodiment, a shunt resistor is provided, comprising two terminals, a semiconductor substrate embodying at least one temperature sensor comprising at least a temperature-sensitive element comprising at least one pn-junction, and at least two metal layers above the semiconductor substrate, at least the upper of the metal layer comprising a path that electrically connects the two terminals, whereby the temperature sensor is below and within the periphery of the upper metal layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict plural embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which are also part of the description. Unless otherwise noted, the description of successive drawings may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, may be arranged, substituted, combined, separated, and designed in a wide variety of different configurations, all of which are explicitly contemplated herein.

Figure 1:
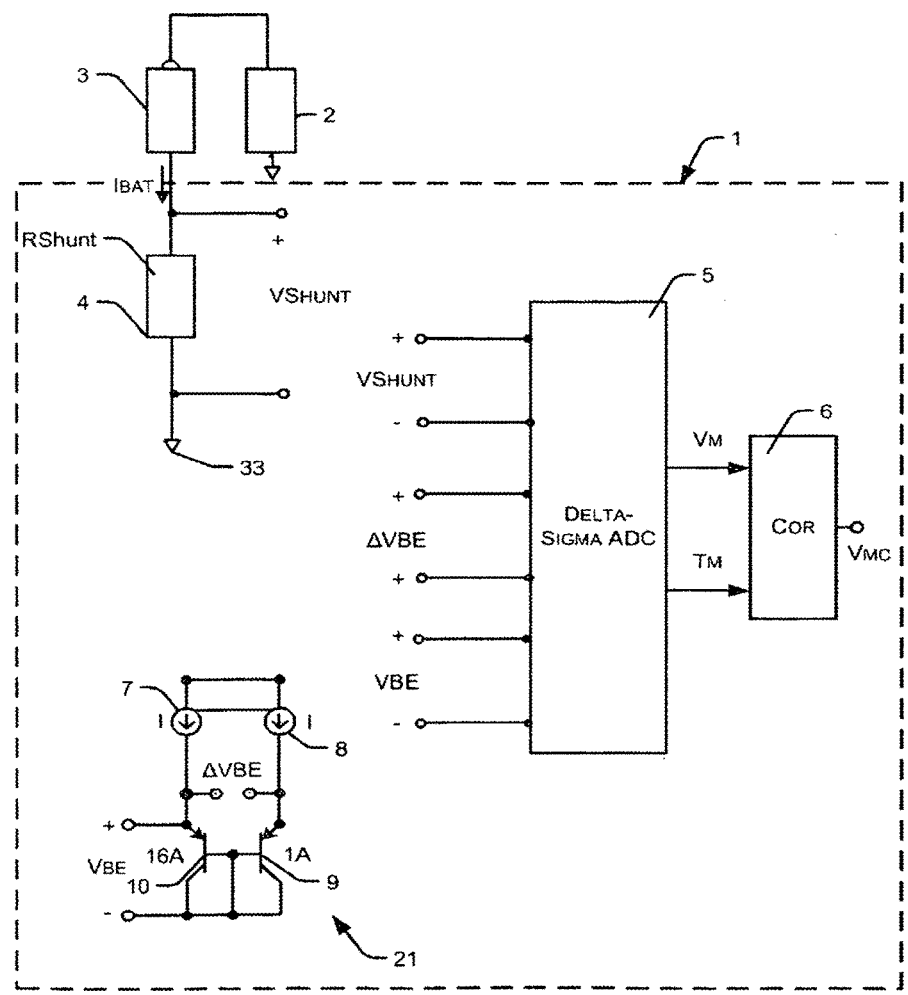
FIG. 1 shows a schematic overview about the functional blocks of a current sensing system (CSS).

FIG. 1 shows a schematic overview of the functional blocks of a current sensing system (CSS) 1. The CSS 1 comprises a load 2, a battery 3 and a shunt resistor 4, an analog-to-digital converter (ADC) 5, a correction circuit 6 and a bandgap reference circuit (BGR) 21. The battery 3 provides a voltage, whereby one terminal of the battery 3 is connected to one terminal of the load, of which the second terminal is connected to ground 33. The second terminal of the battery 3 is connected to a first terminal of the shunt resistor 4, of which the second terminal is connected to ground 33. Thus, the current through the battery also flows to the shunt resistor 4. The voltage between the two terminals of the shunt resistor 4 is Vshunt. Since this is a series connection of elements, this series connection could also be in different order. For example, one could also think to connect the shunt to the positive terminal of the battery. However, the "battery" could be any source of energy. It could be also some electronic circuit, for example a transformer plus rectifier. Also, shunt resistor is used in a 4-wire sensing (Kelvin connection) configuration which illuminates the error in I-to-V conversion caused by shunt parasitic resistor.

The bandgap reference 21 comprises a bipolar first transistor 9, a bipolar second transistor 10, both being pnp transistors. The bases and the collectors of the transistors 9 and 10 are connected to ground 33, whereas the emitter of the first transistor 9 is connected to a first terminal of a first current source 8 and the emitter of the second transistor 10 is connected to a first terminal of a second current source 7. The voltage between collector and emitter of the second transistor 10 is the voltage VBE "diode" voltage with significant negative temperature coefficient and the voltage between the emitters of the first transistor 9 and the second transistor 10 is temperature-dependent voltage Delta VBE positive temperature coefficient. The current through the second transistor 10 is 16 times larger than the current through the first transistor. The dimensions of the current level, the area for the PNPs and the current density ratio should be very well-defined. For this purpose, dynamic element matching techniques may be used. The current density should not be too high where the transistor's parasitic resistor degrade the accuracy, and shouldn't be too low if the betas of the transistors are not the same.

The temperature sensor comprises a temperature sensitive element with at least one pn-junction. There are many possible variants: pnp could be npn, the transistors could be diodes, manipulation of positive and negative TC could be done in the analog domain or in the digital domain after the ADC.

In this case, these "bandgap voltages" serve to determine the temperature. But it is generally well known how to use bandgap elements for temperature measurement. It is also known how to use a single diode for temperature measurements (which in this case would replace the PNPs). In this embodiment, the bandgap voltage is considered to be the temperature sensor having the first and second transistors 9 and 10 to comprise a temperature sensitive element.

The ADC 5 receives the voltages Vshunt, Delta VBE and VBE. The ADC 5 converts, in a time-multiplexed manner, the voltages Vshunt and Delta VB into digital signals Vm and Tm, Vm representing the shunt voltage and Tm the temperature. In this case, Delta VBE and VBE are output signal being output from the temperature sensor. Thus the analog-to-digital converter 5 is coupled to measure a temperature signal being output by the at least one temperature sensor. The the analog-to-digital converter 5 further measures Vshunt.

One could also consider using two ADCs: one for shunt-measurements and the other for temperature measurements. This allows un-interrupted current measurements which might be important in dynamic situations.

The Signals Vm and Tm are input to the correction circuit that outputs a signal Vmc representing a temperature-compensated value for the current through the shunt resistor 4.

Battery current Ibat is measured by digitizing the voltage drop Vshunt across a 10 mΩ metal shunt. Typically, the value of the shunt is chosen depending on the value of the maximum current to be measured resistor Rshunt. The shunt employs four metal layers (M2-to-M5) in parallel, and is quite large to facilitate low ohmic contacts to the outside world via eight bond pads. The four metal layers are stacked vertically when the substrate extends in the horizontal direction. The number of metal layer might differ for various embodiments. However, Rshunt suffers from process spread (up to ±15%) and a large temperature coefficient (about 0.35%/° C.). The former is corrected by room-temperature calibration, while the latter is mitigated by a temperature compensation scheme. This involves measuring the shunt's temperature (with the PNPs of the BGR) and then performing a polynomial correction on the digitized value of Vshunt.

Figure 2:
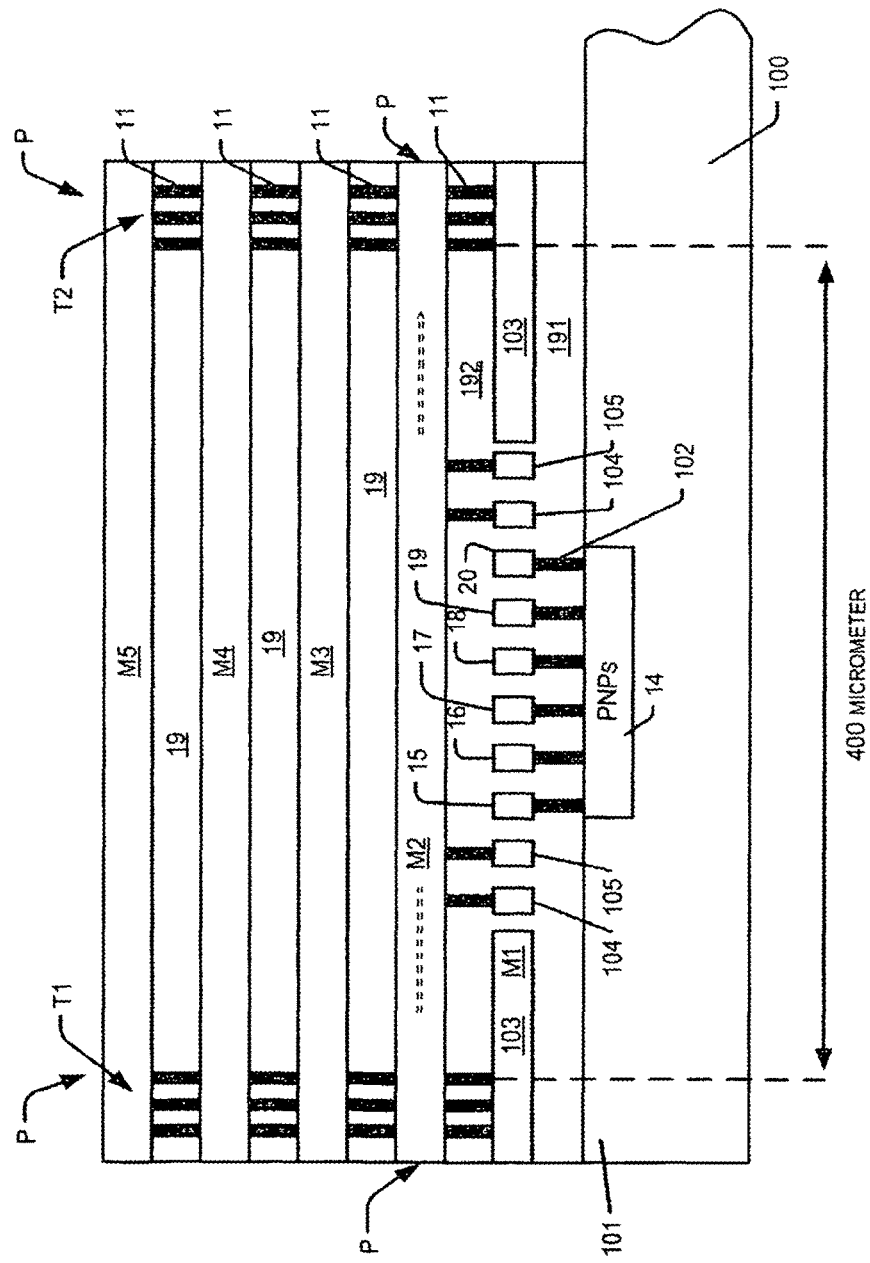
FIG. 2 shows a cross-section through a shunt resistor and a part of a voltage reference circuit of the CSS of FIG. 1.

FIG. 2 shows a cross-section through the shunt resister 4 and the transistors 9 and 10 of the CSS 1 of FIG. 1. FIG. 2 shows a semiconductor substrate 100 that extends in the horizontal direction. The pnp transistors 9 and 10 are embedded in the substrate in a region 14 which is part of the upper surface of the substrate 100. During production of the device, the p- and n-regions of in the region 14 were produced by doping the silicone in the upper surface 101 of the substrate 100. Above the upper surface 101 of the substrate 100, a first oxide layer 191 is provided which is interrupted by vias 102. Above the first oxide layer 191, a first metal layer M1 is provided. The layers above the first metal layer M1 are, in the vertical order from the bottom to the top, a second oxide layer 192, a second metal layer M2, a third oxide layer 193, a third metal layer M3, a fourth oxide layer 194, a fourth metal layer M4, a fifth oxide layer 195 and a fifth metal layer M5. Neighbouring layers are electrically connected to each other by vias 11.

The first metal layer M1 comprises various conductors. The conductors 15, 16, 17, 18, 19 and 20 are connected via the vias 102 to terminals of the transistors 9 and 10. The conductors 103, 104 and 105 are connected to the second metal layer M2, However, it is a goal of an embodiment that the latter conductors do not conduct shunt current because they could have a different and not so well defined temperature coefficient. However, they should conduct the heat from the shunt to the temperature sensor in order to allow accurate temperature measurement of the shunt temperature. Conductors 15-20 serve to electrically connect the temperature sensing elements to the rest of the circuit (current sources, ADC).

Terminals for the shunt resistors 4 are the terminals T1 and T2 on the metal layer where the terminals may be connected by circuitry outside the shunt. The metal layers M2 to MS are connected in parallel such that the shunt resistor has a low resistivity. A low resistivity means low energy losses in the shunt resistor. The first metal layer M1 comprises conductors that are used to connect to terminals of the pnp transistors. Thus, a part of the metal layers that are vertically arranged is used to connect the temperature sensor and the other part is used to carry the current through the shunt resistor. The line 103 of first metal layer M1 is not meant to carry any shunt current, but is used to electrically connect the pnp's and conduct heat from shunt to pnp's. This enables a short thermal coupling between the current conducting layers and the temperature sensor. Thus, the temperature at the sensor is close to the temperature of the conducting layers improving the accuracy of the temperature measurement. Further, providing the temperature sensor below the conducting metal layers saves space in comparison to circuits where the temperature sensor is provided outside of the periphery of the conducting metal layers. Even some of the conductors of the first metal layer M1 are also used for current conducting. Thus, these conductors may also heat up if they conduct current.

There might be other embodiments in which lines of the first metal layer M1 conduct shunt current.

The shunt employs the top metal layers (M2-to-M5), which allows the temperature-sensing PNPs to be located directly underneath it, thus improving a thermal coupling to the shunt. As shown in FIG. 2, this coupling is further improved by the use of thermal vias between the shunt and an M1 sheet surrounding the PNPs. Measurements show that these modifications result in a three times higher improvement in the accuracy of the estimated shunt temperature compared to previous publications.

Joule heating in the parasitic resistance of the connections between the CSS and the outside world represents wasted power. Furthermore, it causes on-chip temperature gradients, which in turn introduce errors in the estimated shunt temperature. To minimize such parasitic resistances, the chip was mounted directly on a PCB, to which the on-chip shunt was connected by 32 short (<1 mm long) bond wires. The total parasitic series resistance is then less than 10 mOhms. In mass production, such low resistances can be achieved by the use of wafer-level packaging and ball-bonding.

To digitize both T and Ibat, the ADC is operated in incremental mode and time-multiplexed: with conversion times of 22.5 ms for Ibat and 2.5 ms for T, respectively. A temperature averaging scheme (TAS) in which the average of two adjacent T measurements is used to compensate each Ibat measurement, results in improved accuracy, especially during transients.

Figure 3:
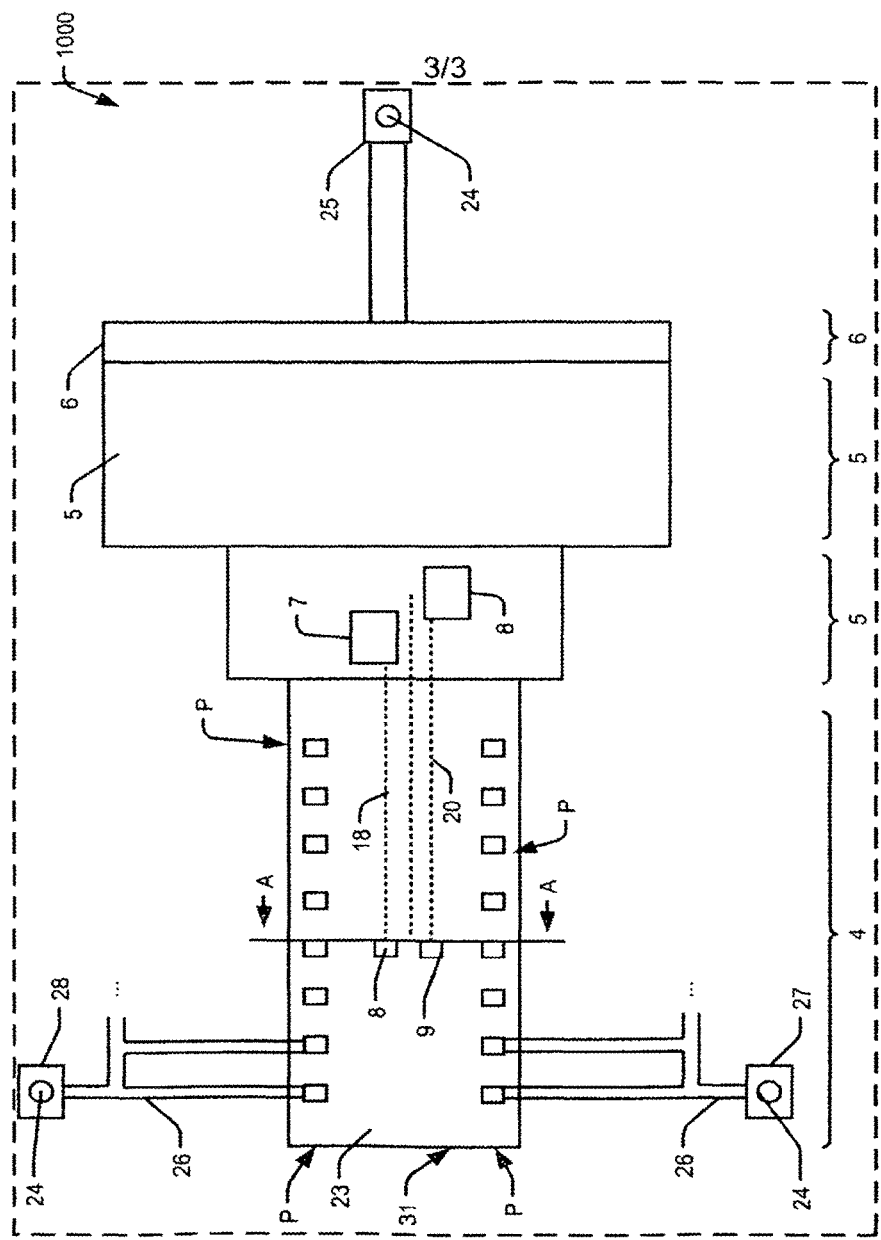
FIG. 3 shows the layout of the CSS of FIG. 1.

FIG. 3 shows layout of the CSS. The CSS is integrated in an integrated circuit 1000, which means that the parts of the CSS share a common silicon substrate, the substrate 100 shown in FIG. 2.

The components of the CSS that are arranged from the left to the right in the subsequent order are: shunt resister 4, bandgap 21, analog-digital-converter 5 and correction circuit 6. The shunt resister 4 is a top-down view. The line A-A indicates the cross-section of FIG. 2. The metal layer MS comprises an uninterrupted conductor 23. On the top of the uninterrupted conductor 23, terminals 30 are provided, which are connected by conductors 26 to bond pads 27 that are connected to the outside of the integrated circuit 1000 by wire bonds 27. The terminals 30 define the periphery P. The current through the terminals of the shunt resistor flows within the periphery P. In other words, the path between the terminals is within the periphery P. The transistors 9 and 10, these being the PNPs that are part of the "bandgap", under the metal layer 23 are arranged in a middle position having about the same distances to the periphery lines. The transistors are within the periphery of the metal layers ensuring that they are—in the planar view of FIG. 3—not outside of the metal conductors. Conductors 18 and 20, which are part of the first metal layer 18 extend to the current sources 7 and 8. The analog-to-digital converter is provided right of the bandgap 21, receiving voltages from the bandgap 21 and from the shunt resistor 4. Right of the analog-digital-converter is the digital correction circuit that compensates inter alia for the temperature-dependency of the shunt resistor 4. The compensated output value the output the bond pad 25, which is connected to a wire bond that connects external components to the integrated circuit 1000.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. An integrated circuit, comprising:
    a semiconductor substrate including at least one temperature sensor comprising at least a temperature sensitive element;
    a shunt resistor comprising two terminals and at least two metal layers above the semiconductor substrate, wherein at least an upper metal layer of the at least two metal layers comprises a path that electrically connects the two terminals and a lower metal layer of the at least two metal layers comprises conductors that are connected to terminals of transistors of the temperature sensor, and wherein the temperature sensor is below and within the periphery of the upper metal layer; and
    heat conducting elements for improving thermal conductivity from the shunt resistor to the temperature sensing element.

2. The integrated circuit of claim 1, wherein the lower metal layer comprises further conductors that are electrically connected to the upper metal layer.

3. The integrated circuit of claim 1, wherein the temperature sensitive element comprises a least one pn-junction.

4. The integrated circuit of claim 3, wherein the temperature sensitive element comprises a transistor.

5. The integrated current circuit of claim 1, further comprising an analog-to-digital-converter configured to measure a voltage between terminals of the shunt resistor.

6. The integrated current circuit of claim 5, wherein the analog-to-digital-converter is further configured to measure a temperature signal output by the at least one temperature sensor.

7. The integrated circuit of claim 1, wherein the at least two metal layers comprise at least four metal layers.

8. The integrated circuit of claim 7, further comprising at least one further metal layer comprising a further path that electrically connects the two terminals.

9. The integrated circuit of claim 2, further comprising at least one further metal layer comprising a further path that electrically connects the two terminals.

10. The integrated circuit of claim 9, wherein the temperature sensitive element comprises at least one pn-junction.

11. The integrated circuit of claim 2, wherein the temperature sensitive element comprises at least one pn-junction.

12. An integrated circuit, comprising:
    a semiconductor substrate including at least one temperature sensor comprising at least a temperature sensitive element;
    a shunt resistor comprising two terminals and at least two metal layers above the semiconductor substrate, wherein at least an upper metal layer of the at least two metal layers comprises a path that electrically connects the two terminals and a lower metal layer of the at least two metal layers comprises conductors that are connected to terminals of transistors of the temperature sensor, and wherein the temperature sensor is below and within the periphery of the upper metal layer; and
    at least one further metal layer comprising a further path that electrically connects the two terminals.

* * * * *